(12) United States Patent
Malatkar

(10) Patent No.: US 9,831,213 B2
(45) Date of Patent: Nov. 28, 2017

(54) BUMPLESS BUILD-UP LAYER PACKAGE WITH PRE-STACKED MICROELECTRONIC DEVICES

(71) Applicant: Intel Corporation, Santa Clara, CA (US)

(72) Inventor: Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/170,833

(22) Filed: Jun. 1, 2016

(65) Prior Publication Data

US 2016/0276317 A1  Sep. 22, 2016

Related U.S. Application Data

(63) Continuation of application No. 14/269,318, filed on May 5, 2014, now Pat. No. 9,362,253, which is a
(Continued)

(51) Int. Cl.
*H01L 23/48* (2006.01)
*H01L 23/00* (2006.01)
(Continued)

(52) U.S. Cl.
CPC .......... *H01L 24/83* (2013.01); *H01L 21/568* (2013.01); *H01L 23/29* (2013.01); *H01L 23/3135* (2013.01); *H01L 23/3142* (2013.01); *H01L 23/481* (2013.01); *H01L 23/5226* (2013.01); *H01L 23/538* (2013.01); *H01L 24/19* (2013.01);
(Continued)

(58) Field of Classification Search
CPC .......... H01L 24/83; H01L 2224/83951; H01L 23/481; H01L 23/538; H01L 25/117; H01L 25/074; H01L 25/0657; H01L 41/083; H01L 2225/06503; H01L 2225/06541; H01L 21/568; H01L 23/3135;
(Continued)

(56) References Cited

U.S. PATENT DOCUMENTS 4,497,033 A  1/1985 Hernandez et al.
5,353,498 A  10/1994 Fillion et al.
(Continued)

FOREIGN PATENT DOCUMENTS

WO  WO 2012/027075 A2  3/2012
WO  WO 2012/027075 A3  5/2012

OTHER PUBLICATIONS

Official Letter including Search Report from the Taiwan Intellectual Property Office for Taiwan Patent Application No. 100128180 and English Translation of Search Report.
(Continued)

*Primary Examiner* — Fei Fei Yeung Lopez
(74) *Attorney, Agent, or Firm* — Schwabe, Williamson & Wyatt P.C.

(57) ABSTRACT

The present disclosure relates to the field of integrated circuit package design and, more particularly, to packages using a bumpless build-up layer (BBUL) designs. Embodiments of the present description relate to the field of fabricating microelectronic packages, wherein a first microelectronic device having through-silicon vias may be stacked with a second microelectronic device and used in a bumpless build-up layer package.

10 Claims, 5 Drawing Sheets

Related U.S. Application Data continuation of application No. 12/868,816, filed on Aug. 26, 2010, now Pat. No. 8,754,516.

(51) Int. Cl.
| | |
|---|---|
| *H01L 23/538* | (2006.01) |
| *H01L 25/11* | (2006.01) |
| *H01L 25/07* | (2006.01) |
| *H01L 41/083* | (2006.01) |
| *H01L 25/065* | (2006.01) |
| *H01L 23/522* | (2006.01) |
| *H01L 21/56* | (2006.01) |
| *H01L 23/29* | (2006.01) |
| *H01L 23/31* | (2006.01) |

(52) U.S. Cl.
CPC .............. *H01L 24/20* (2013.01); *H01L 24/24* (2013.01); *H01L 25/0657* (2013.01); *H01L 25/074* (2013.01); *H01L 25/117* (2013.01); *H01L 41/083* (2013.01); *H01L 2224/0401* (2013.01); *H01L 2224/0557* (2013.01); *H01L 2224/12105* (2013.01); *H01L 2224/16145* (2013.01); *H01L 2224/16146* (2013.01); *H01L 2224/16148* (2013.01); *H01L 2224/16225* (2013.01); *H01L 2224/24105* (2013.01); *H01L 2224/24226* (2013.01); *H01L 2224/32145* (2013.01); *H01L 2224/32225* (2013.01); *H01L 2224/73204* (2013.01); *H01L 2224/73209* (2013.01); *H01L 2224/73259* (2013.01); *H01L 2224/80001* (2013.01); *H01L 2224/83951* (2013.01); *H01L 2224/92224* (2013.01); *H01L 2225/06503* (2013.01); *H01L 2225/06513* (2013.01); *H01L 2225/06517* (2013.01); *H01L 2225/06541* (2013.01); *H01L 2225/06544* (2013.01); *H01L 2225/06568* (2013.01); *H01L 2225/06586* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01079* (2013.01); *H01L 2924/12042* (2013.01); *H01L 2924/14* (2013.01); *H01L 2924/18161* (2013.01)

(58) Field of Classification Search
CPC ..... H01L 23/3142; H01L 24/19; H01L 24/20; H01L 24/24
See application file for complete search history.

(56) References Cited

U.S. PATENT DOCUMENTS

| | | | |
|---|---|---|---|
| 5,527,741 A | 6/1996 | Cole et al. | |
| 5,834,945 A * | 11/1998 | Akram | G01R 1/0483 324/756.05 |
| 5,841,193 A | 11/1998 | Eichelberger | |
| 5,866,943 A | 2/1999 | Mertor | |
| 6,046,507 A | 4/2000 | Hatchard et al. | |
| 6,133,638 A * | 10/2000 | Farnworth | H01L 23/32 257/737 |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,489,185 B1 | 12/2002 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,160,755 B2 | 1/2007 | Lo et al. | |
| 7,183,658 B2 | 2/2007 | Towle et al. | |
| 7,189,596 B1 | 3/2007 | Ma et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,476,563 B2 | 1/2009 | Mangrum et al. | |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 8,313,958 B2 | 11/2012 | Swaminathan et al. | |
| 8,319,318 B2 | 11/2012 | Nalla et al. | |
| 8,372,666 B2 | 2/2013 | Crawford et al. | |
| 8,431,438 B2 | 4/2013 | Nalla et al. | |
| 8,535,989 B2 | 9/2013 | Sankman et al. | |
| 8,618,652 B2 | 12/2013 | Nalla et al. | |
| 8,742,561 B2 | 6/2014 | Guzek | |
| 8,754,516 B2 | 6/2014 | Malatkar | |
| 2001/0004651 A1 * | 6/2001 | Tomiyoshi | C08K 3/36 524/493 |
| 2001/0028545 A1 * | 10/2001 | Hayashi | H01L 27/0805 361/303 |
| 2002/0053727 A1 | 5/2002 | Kimura | |
| 2002/0187591 A1 * | 12/2002 | Bai | H01L 21/563 438/126 |
| 2003/0025199 A1 | 2/2003 | Wu et al. | |
| 2003/0099097 A1 * | 5/2003 | Mok | G01R 1/06716 361/767 |
| 2004/0212067 A1 | 10/2004 | Wang | |
| 2004/0238936 A1 | 12/2004 | Rumer et al. | |
| 2006/0035409 A1 | 2/2006 | Suh et al. | |
| 2007/0152313 A1 | 7/2007 | Periaman et al. | |
| 2007/0155048 A1 | 7/2007 | Lee et al. | |
| 2007/0246806 A1 | 10/2007 | Ong et al. | |
| 2008/0054448 A1 | 3/2008 | Lu et al. | |
| 2008/0093723 A1 | 4/2008 | Myers et al. | |
| 2008/0272486 A1 * | 11/2008 | Wang | H01L 21/563 257/737 |
| 2008/0315377 A1 | 12/2008 | Eichelberger et al. | |
| 2008/0315391 A1 * | 12/2008 | Kohl | H01L 21/6835 257/690 |
| 2009/0072382 A1 | 3/2009 | Guzek | |
| 2009/0079063 A1 | 3/2009 | Chrysler et al. | |
| 2009/0079064 A1 | 3/2009 | Tang et al. | |
| 2009/0200662 A1 * | 8/2009 | Ng | H01L 21/486 257/723 |
| 2009/0212416 A1 | 8/2009 | Skeete | |

(56) References Cited

U.S. PATENT DOCUMENTS

| | | |
|---|---|---|
| 2009/0283898 A1 | 11/2009 | Janzen et al. |
| 2009/0294942 A1 | 12/2009 | Palmer et al. |
| 2009/0321947 A1 | 12/2009 | Pratt |
| 2010/0007032 A1* | 1/2010 | Gallegos ............... H01L 21/563 257/777 |
| 2010/0044855 A1 | 2/2010 | Eichelberger et al. |
| 2010/0047970 A1 | 2/2010 | Eichelberger et al. |
| 2010/0109138 A1 | 5/2010 | Cho |
| 2010/0140779 A1 | 6/2010 | Lin et al. |
| 2010/0140805 A1 | 6/2010 | Chang et al. |
| 2011/0032598 A1 | 2/2011 | Horikawa et al. |
| 2011/0101491 A1 | 5/2011 | Skeete et al. |
| 2011/0108999 A1 | 5/2011 | Nalla et al. |
| 2011/0115064 A1* | 5/2011 | Radojcic ............. H01L 25/0657 257/686 |
| 2011/0140247 A1 | 6/2011 | Pagaila et al. |
| 2011/0215464 A1 | 9/2011 | Guzek et al. |
| 2011/0228464 A1 | 9/2011 | Guzek et al. |
| 2012/0001339 A1 | 1/2012 | Malatkar |
| 2012/0049382 A1 | 3/2012 | Malatkar |

OTHER PUBLICATIONS

International Search Report and Written Opinion received for PCT Patent Application No. PCT/US2011/046287 dated Mar. 26, 2012, 10 pages.

International Preliminary Report on Patentability and Written Opinion received for PCT/US2011/046287, dated Mar. 7, 2013, 7 pages.

Notice of Allowance (2 pages) from the Taiwan Intellectual Property Office for Taiwan Patent Application No. 105110566 and English Translation (1 page) thereof.

Office Action and Search Report for Taiwan Patent Application No. 105141885 dated Aug. 22, 2017, 3 pgs., no English translation.

* cited by examiner

BUMPLESS BUILD-UP LAYER PACKAGE WITH PRE-STACKED MICROELECTRONIC DEVICES

This is a Continuation of application Ser. No. 14/269,318 filed May 5, 2014 which is a Continuation of application Ser. No. 12/868,816 filed Aug. 26, 2010 now U.S. Pat. No. 8,754,516 issued Jun. 17, 2014, which are hereby incorporated by reference.

BACKGROUND

Embodiments of the present description generally relate to the field of microelectronic device package designs and, more particularly, to a microelectronic device package having pre-stacked microelectronic devices in a bumpless build-up layer (BBUL) design.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
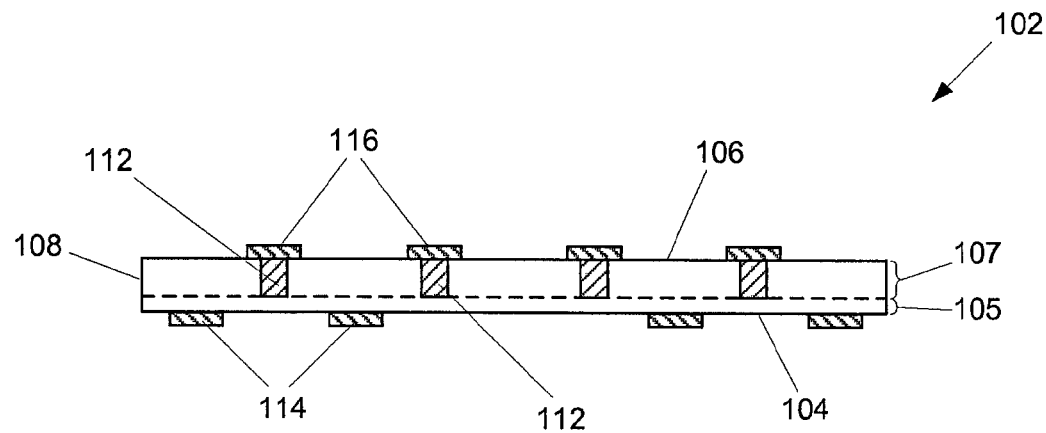
FIGS. 1-9 illustrate side cross-sectional views of a process of forming a microelectronic device package having pre-stacked microelectronic devices in a bumpless build-up layer design.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein a first microelectronic device having through-silicon vias may be stacked with a second microelectronic device and used in a bumpless build-up layer package.

FIGS. 1-8 illustrate cross-sectional views of an embodiment of a process of forming a bumpless build-up layer coreless (BBUL-C) microelectronic package. As shown in FIG. 1, a first microelectronic device 102 may be provided, wherein the first microelectronic device 102 includes an active surface 104, an opposing back surface 106 that is substantially parallel to the first microelectronic device active surface 104, and at least one side 108 extending from the first microelectronic device active surface 104 to the first microelectronic device back surface 106. The first microelectronic device 102 may have an active portion 105 proximate the first microelectronic device active surface 104 and a substrate portion 107 extending from the first microelectronic device active portion 105 to the first microelectronic device back surface 106. As will be understood to those skilled in the art, the first microelectronic device active portion 105 comprises the integrated circuitry and interconnections (not shown) of the first microelectronic device 102. The first microelectronic device 102 may be any appropriate integrated circuit device including but not limited to a microprocessor (single or multi-core), a memory device, a chipset, a graphics device, an application specific integrated circuit, or the like. In one embodiment, the first microelectronic device 102 is a microprocessor.

The first microelectronic device 102 may have at least one conductive via extending through the first microelectronic device substrate portion 107 from the first microelectronic device back surface 106 to the first microelectronic device active portion 105. Such a conductive via configuration is known as a through-silicon via 112. The first microelectronic device through-silicon via(s) 112 may be in electrical communication with the integrated circuitry (not shown) in the first microelectronic device active portion 105. Each first microelectronic device through-silicon via 112 may have a contact land 116 on the first microelectronic device back surface 106. Although the first microelectronic device back surface contact lands are shown directly adjacent the first microelectronic device through-silicon vias 112, it is understood that they may be positioned at any appropriate location on the first microelectronic die back surface with conductive traces forming electrical contact therebetween. The first microelectronic device through-silicon vias 112 and the first microelectronic device back surface contact lands 116 may be fabricated by any technique known in the art, including, but not limited to drilling (laser and ion), lithography, plating, and deposition, and may be made of any appropriate conductive material, including but not limited to copper, aluminum, silver, gold, or alloys thereof.

Figure 2:
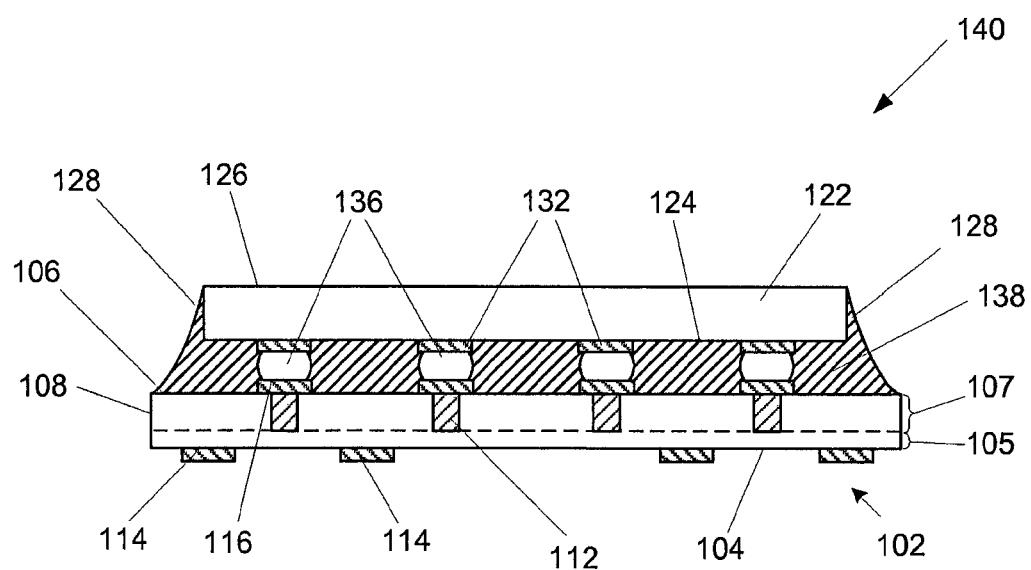

As shown in FIG. 2, a second microelectronic device 122 may be aligned with the first microelectronic device 102. The second microelectronic device 122 may have an active surface 124, a back surface 126 that is substantially parallel to the second microelectronic device active surface 124, and at least one side 128 extending from the second microelectronic device active surface 124 to the second microelectronic device back surface 126. The second microelectronic device 122 may further include at least one contact land 132 adjacent the microelectronic device active surface 124, wherein the second microelectronic device contact lands 132 may be connected to integrated circuits (not shown) within the second microelectronic device 122. The second microelectronic device 122 may be any appropriate integrated circuit device including but not limited to a microprocessor (single or multi-core), a memory device, a chipset, a graphics device, an application specific integrated circuit, or the like. In one embodiment, the second microelectronic device 122 is a memory device. The second microelectronic device contact lands 132 may be any appropriate conductive material, including but not limited to copper, aluminum, silver, gold, or alloys thereof.

As further shown in FIG. 2, the second microelectronic device 122 may be attached to the first microelectronic device 102 through a plurality of interconnects 136 (shown as solder balls) connecting the second microelectronic device contact lands 132 to the first microelectronic device back surface contact lands 116, thereby forming a stacked structure 140. An underfill material 138, such as an epoxy material, may be disposed between the first microelectronic device back surface 106 and the second microelectronic device active surface 124, and around the plurality of interconnects 136. The underfill material 138 may enhance the structural integrity of the stacked structure 140.

Figure 3:
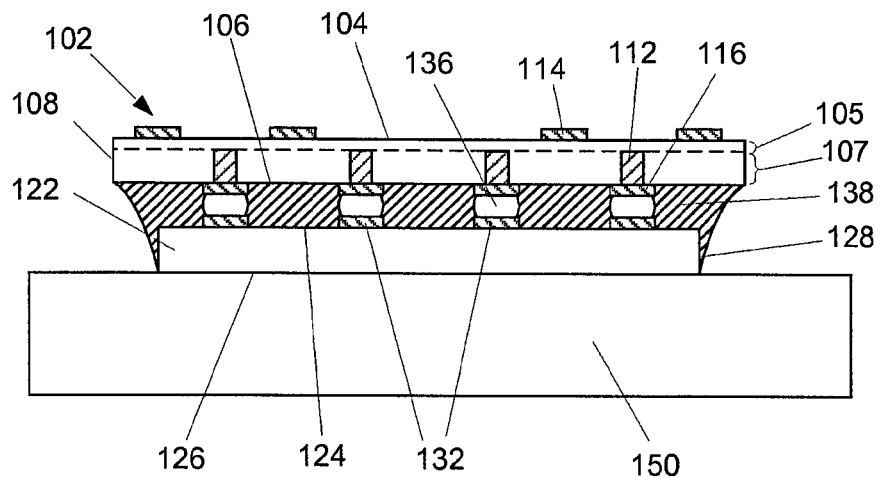
Figure 4:
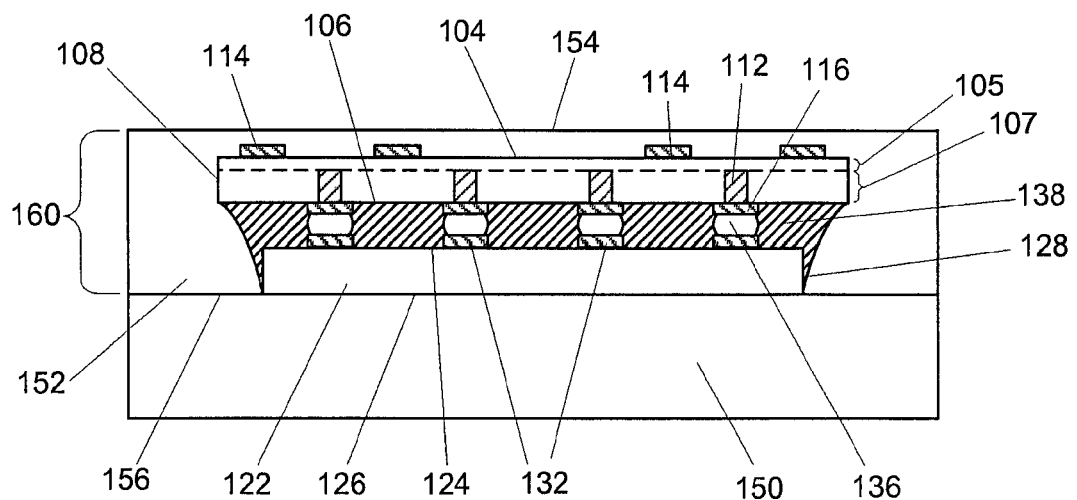

As shown in FIG. 3, the second microelectronic device back surface 126 may be attached to a carrier 150, such as with a DBF (die backside film) or an adhesive (not shown), as known to those skilled in the art. An encapsulation material 152 may be disposed adjacent the second microelectronic device side(s) 128, the first microelectronic side(s) 108, and over the first microelectronic device active surface 104 including the first microelectronic device active surface contact land(s) 114, thereby forming a front surface 154 of the encapsulation material 152, as shown in FIG. 4. The placement of the second microelectronic device back surface 126 on the carrier 150 may result in a back surface 156 of the encapsulation material 152 being formed substantially planar with the second microelectronic device back surface 126, thereby forming substrate 160.

The encapsulation material 152 may be disposed by any process known in the art, including a laminated process, as will be understood to those skilled in the art, and may be any appropriate dielectric material, including, but not limited to silica-filled epoxies, such as are available from Ajinomoto Fine-Techno Co., Inc., 1-2 Suzuki-cho, Kawasaki-ku, Kawasaki-shi, 210-0801, Japan (Ajinomoto GX13, Ajinomoto GX92, and the like).

Figure 5:
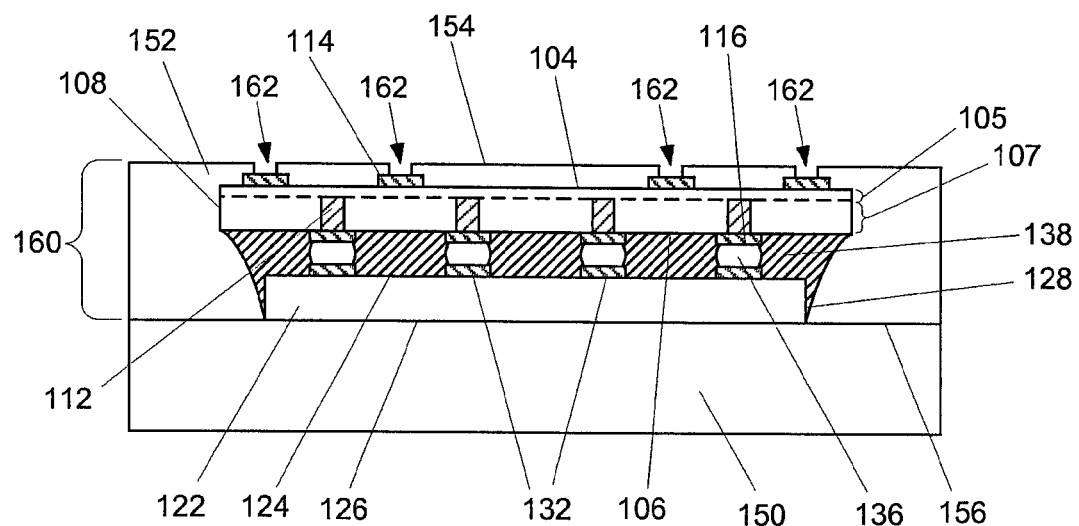
Figure 6:
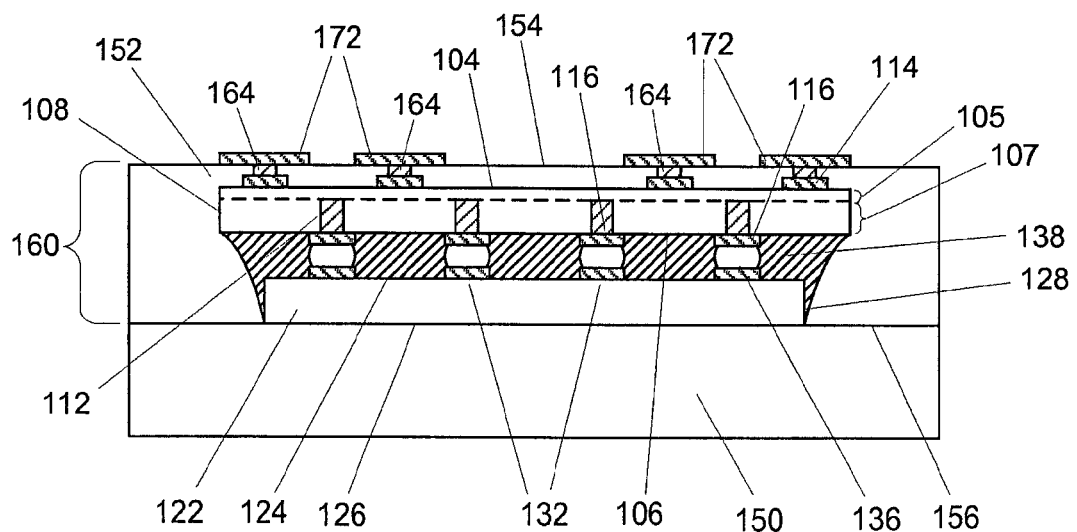

Vias 162 may be formed through the encapsulation material front surface 154 to expose at least a portion of each first microelectronic device active surface contact land 114, as shown in FIG. 5. The vias 162 of FIG. 5 may be formed by any technique known in the art, including but not limited to laser drilling, ion drilling, and lithography, as will be understood to those skilled in the art. A patterning and plating process may be used to fill the vias 162 to form conductive vias 164 and to simultaneously form first layer conductive traces 172, as will be understood by those skilled in the art, as shown in FIG. 6.

Figure 7:
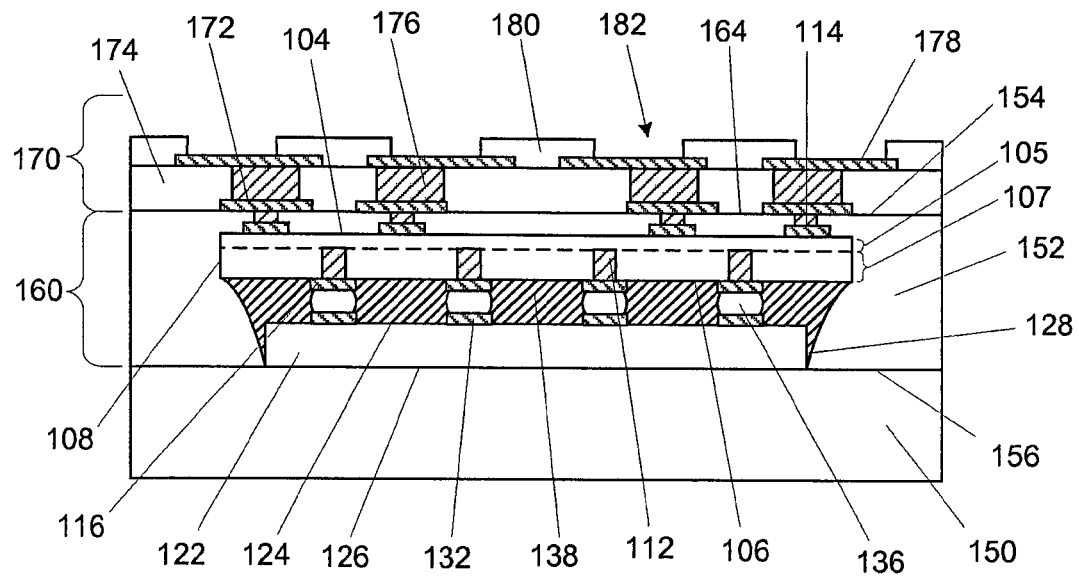

As shown in FIG. 7, a build-up layer 170 may be formed on the encapsulation material front surface 154. The build-up layer 170 may comprise a plurality of dielectric layers with conductive traces formed on each dielectric layer with conductive vias extending through each dielectric layer to connect the conductive traces on different layers. Referring to FIG. 7, the build-up layer 170 may comprise the first layer conductive traces 172 with a dielectric layer 174 formed adjacent the first layer conductive traces 172 and the encapsulation material front surface 154. At least one trace-to-trace conductive via 176 may extend through the dielectric layer 174 to connect at least one first layer conductive trace 172 to a second layer conductive trace 178. A solder resist material 180 may be patterned on the dielectric layer 174 and second layer conductive traces 178 having at least one opening 182 exposing at least a portion of the second layer conductive traces 178.

Figure 8:
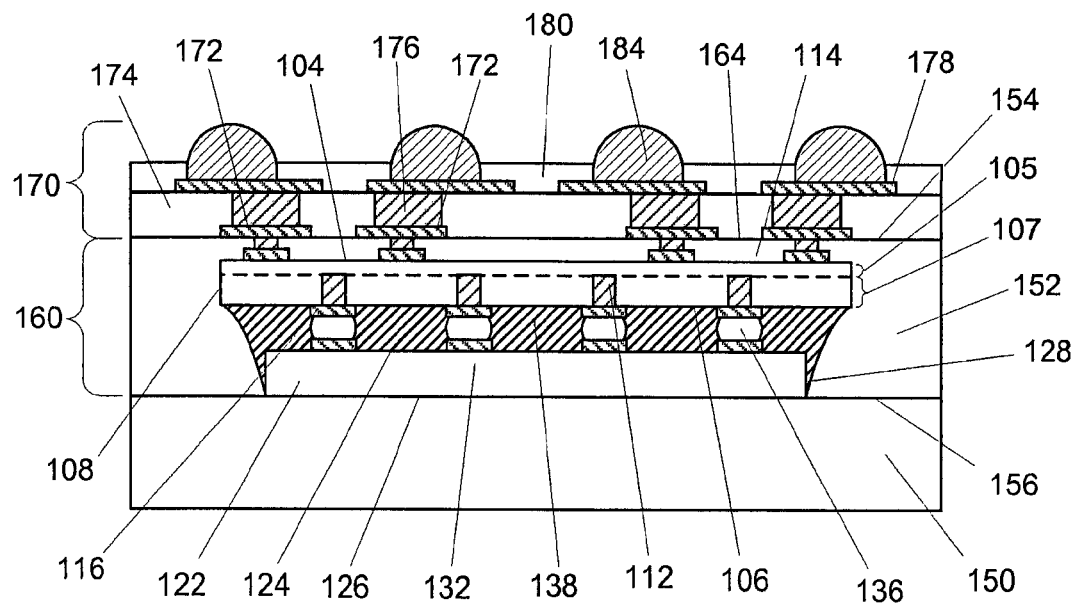

As shown in FIG. 8, at least one external interconnect 184 may be formed on the second layer conductive traces 178 through patterned openings 182 in the solder resist material 180. The external interconnects 184 may be a solder material and may be used to connect the build-up layer 170 to external components (not shown).

It is understood that although only one dielectric layer and two conductive trace layers are shown, the build-up layer 170 may be any appropriate number of dielectric layers and conductive trace layers. The dielectric layer(s), such as the dielectric layer 174, may be formed by any technique known in the art and may be any appropriate dielectric material. The conductive trace layers, such as first layer conductive traces 172 and the second layer conductive traces 178, and the conductive vias 176, may be fabricated by any technique known in the art, including but not limited to plating and lithography, and may be made of any appropriate conductive material, including but not limited to copper, aluminum, silver, gold, or alloys thereof.

Figure 9:
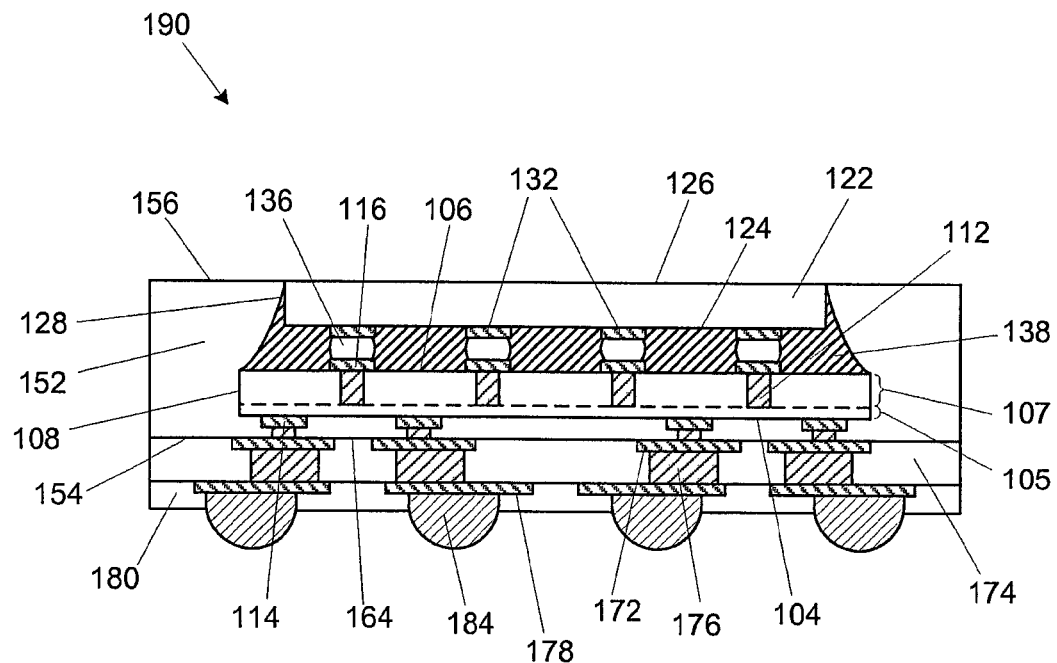

The carrier 150 may be removed, resulting in a microelectronic package 190, as shown in FIG. 9. The stacking and encapsulation of the first microelectronic device 102 and the second microelectronic device 122 results in the microelectronic package 190 being sufficiently thick enough to prevent warpage in the microelectronic package 190, which may result in a reduction in yield losses from solder ball bridging and/or non-contact opens, as will be understood to those skilled in the art.

Figure 10:
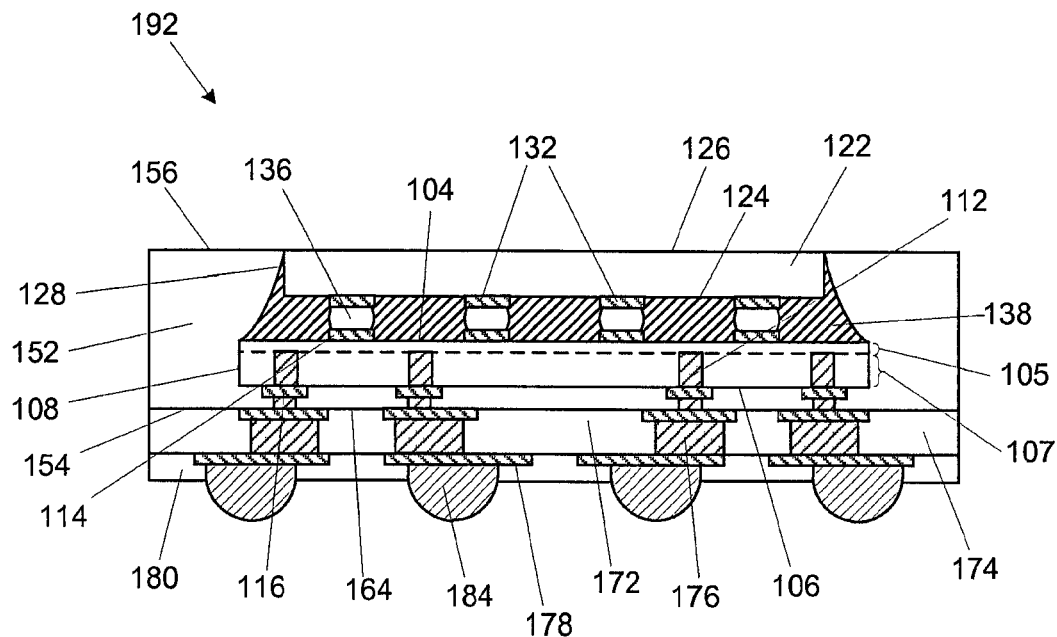
FIG. 10 illustrates a side cross-sectional view of another embodiment of a microelectronic device package having pre-stacked microelectronic devices in a bumpless build-up layer design.

Another embodiment of a microelectronic package 192 is shown in FIG. 10. In this embodiment, the first microelectronic device active surface 104 may be in electrical communication with the second microelectronic device active surface 124 through the interconnects 136 extending between the first microelectronic device active surface contact land 114 and the second microelectronic device contact lands 132. The build-up layer 170 may be formed proximate on the first microelectronic device back surface and may be in electrical communication with the first microelectronic device through-silicon vias 112.

It is also understood that the subject matter of the present description is not necessarily limited to specific applications illustrated in FIGS. 1-10. The subject matter may be applied to other stacked device applications. Furthermore, the subject matter may also be used in any appropriate application outside of the microelectronic device fabrication field. Furthermore, the subject matter of the present description may be a part of a larger bumpless build-up package, it may include multiple stacked microelectronic dice, it may be formed at a wafer level, or any number of appropriate variations, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A microelectronic package, comprising:
   a bumpless build-up layer (BBUL) substrate;
   a plurality of stacked microelectronic dies above the BBUL substrate, the plurality of stacked microelectronic dies having a bottommost microelectronic die proximate the BBUL substrate, and a next bottommost microelectronic die above the bottommost microelectronic die, wherein the bottommost microelectronic die has a plurality of front side lands on an active portion facing the BBUL substrate and a plurality of backside lands facing the next bottommost microelectronic die with a plurality of through silicon vias (TSVs) electrically coupling the backside lands and the front side lands of the bottommost microelectronic die, wherein the next bottommost microelectronic die has a plurality of front side lands facing the bottommost microelectronic die, wherein the plurality of backside lands of the bottommost microelectronic die is directly coupled to the plurality of front side lands of the next bottommost microelectronic die by a solder layer, and wherein the plurality of front side lands of the bottommost microelectronic die electrically couples the bottommost microelectronic die to the BBUL substrate, wherein the TSVs of the bottommost microelectronic die are in direct contact with the backside lands of the bottommost microelectronic die but are not in direct contact with the front side lands of the bottommost microelectronic die;
   an underfill material layer between the bottommost microelectronic die and the next bottommost microelectronic die; and
   an encapsulation material over the BBUL substrate and laterally adjacent to the bottommost microelectronic die, the next bottommost microelectronic die and the underfill material layer, wherein the encapsulation material is separate and distinct from the underfill material layer.

2. The microelectronic package of claim 1, wherein the encapsulation material has an uppermost surface substantially co-planar with an uppermost surface of an uppermost microelectronic die of the plurality of stacked microelectronic dies.

3. The microelectronic package of claim 2, wherein the next bottommost microelectronic die is the uppermost microelectronic die of the plurality of stacked microelectronic dies, and wherein the uppermost surface of the encapsulation material is substantially co-planar with an uppermost surface of the next bottommost microelectronic die distal from the BBUL substrate.

4. The microelectronic package of claim 1, wherein the encapsulation material comprises a silica-filled epoxy.

5. A method of fabricating a microelectronic package, the method comprising:
   forming a plurality of stacked dies comprising at least a first die and a second die above a carrier, wherein the first die has a plurality of front side lands and has a plurality of backside lands facing the second die with a plurality of through silicon vias (TSVs) electrically coupling the backside lands and the front side lands of the first die, wherein the second die has a plurality of front side lands facing the first die, wherein the plurality of backside lands of the first die is directly coupled to the plurality of front side lands of the second die by a solder layer;

subsequent to forming the plurality of stacked dies, forming an underfill material layer between the first die and the second die;

subsequent to forming the underfill material layer, forming an encapsulation material over the carrier and laterally adjacent to the first die, the second die and the underfill material layer;

subsequent to forming the encapsulation material, forming a bumpless build-up layer (BBUL) substrate over the encapsulation material, wherein the plurality of front side lands of the first die electrically couples the first die to the BBUL substrate; and subsequent to forming the BBUL substrate, removing the carrier.

6. The method of claim 5, wherein forming the encapsulation material comprises forming a silica-filled epoxy.

7. The method of claim 5, wherein the encapsulation material has a lowermost surface substantially co-planar with a lowermost surface of a lowermost die of the plurality of stacked dies.

8. The method of claim 7, wherein the second die is the lowermost die of the plurality of stacked dies, and wherein the lowermost surface of the encapsulation material is substantially co-planar with lowermost surface of the second die proximate the carrier.

9. The method of claim 5, wherein the TSVs of the first die are in direct contact with the backside lands of the bottommost die but are not in direct contact with the front side lands of the bottommost die.

10. A microelectronic package, comprising:

a bumpless build-up layer (BBUL) substrate;

a plurality of stacked dies above the BBUL substrate, the plurality of stacked dies having a bottommost die proximate the BBUL substrate, and a next bottommost die above the bottommost die, wherein the bottommost die has a plurality of front side lands facing the BBUL substrate and a plurality of backside lands facing the next bottommost die with a plurality of through silicon vias (TSVs) electrically coupling the backside lands and the front side lands of the bottommost die, wherein the next bottommost die has a plurality of front side lands facing the bottommost die, wherein the plurality of backside lands of the bottommost die is directly coupled to the plurality of front side lands of the next bottommost die by a solder layer, and wherein the plurality of front side lands of the bottommost die electrically couples the bottommost die to the BBUL substrate, wherein the TSVs of the bottommost die are in direct contact with the backside lands of the bottommost die but are not in direct contact with the front side lands of the bottommost die;

an underfill material layer between the bottommost die and the next bottommost die; and an encapsulation material over the BBUL substrate and laterally adjacent to the bottommost die, the next bottommost die and the underfill material layer, wherein the encapsulation material is separate and distinct from the underfill material layer.

* * * * *